United States Patent
Watanabe et al.

(10) Patent No.: US 10,156,024 B2
(45) Date of Patent: Dec. 18, 2018

(54) ZINC OXIDE FREE-STANDING SUBSTRATE AND METHOD FOR MANUFACTURING SAME

(71) Applicant: NGK INSULATORS, LTD., Nagoya-Shi (JP)

(72) Inventors: Morimichi Watanabe, Nagoya (JP); Jun Yoshikawa, Nagoya (JP); Hirofumi Yamaguchi, Nagoya (JP); Tsutomu Nanataki, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 140 days.

(21) Appl. No.: 14/951,548

(22) Filed: Nov. 25, 2015

(65) Prior Publication Data

US 2016/0145768 A1 May 26, 2016

Related U.S. Application Data

(63) Continuation of application No. PCT/JP2014/063221, filed on May 19, 2014.

(30) Foreign Application Priority Data

| May 31, 2013 | (JP) | 2013-115753 |
| Jan. 31, 2014 | (JP) | 2014-016606 |

(51) Int. Cl.
| C30B 29/16 | (2006.01) |
| C30B 19/12 | (2006.01) |
| C01G 9/02 | (2006.01) |
| C30B 7/00 | (2006.01) |
| C30B 28/04 | (2006.01) |
| C30B 29/60 | (2006.01) |
| C30B 1/10 | (2006.01) |
| H01B 1/02 | (2006.01) |
| C30B 7/10 | (2006.01) |
| C30B 7/14 | (2006.01) |
| C30B 1/02 | (2006.01) |

(52) U.S. Cl.
CPC .............. C30B 29/16 (2013.01); C01G 9/02 (2013.01); C30B 1/10 (2013.01); C30B 7/005 (2013.01); C30B 7/10 (2013.01); C30B 7/14 (2013.01); C30B 28/04 (2013.01); C30B 29/605 (2013.01); H01B 1/02 (2013.01); C01P 2002/60 (2013.01); C01P 2006/40 (2013.01); C30B 1/02 (2013.01); C30B 19/12 (2013.01)

(58) Field of Classification Search
CPC ......... C30B 29/16; C30B 29/605; C30B 7/14; C30B 7/10; C30B 7/005; C30B 28/04
See application file for complete search history.

(56) References Cited

U.S. PATENT DOCUMENTS

| 6,469,416 B1 * | 10/2002 | Itakura ............... H03H 9/02574 |
| | | 310/313 A |
| 2002/0045531 A1 * | 4/2002 | Suzuki .................. B82Y 30/00 |
| | | 501/98.4 |
| 2007/0108866 A1 | 5/2007 | Conley, Jr. et al. |
| 2010/0209686 A1 | 8/2010 | Sekiwa et al. |
| 2013/0168693 A1 | 7/2013 | Satoh et al. |

FOREIGN PATENT DOCUMENTS

| JP | 2004-315342 | 11/2004 |
| JP | 2004-315361 | 11/2004 |
| JP | 2006-264316 A | 10/2006 |
| JP | 2007-137757 | 6/2007 |
| JP | 2008-230906 | 10/2008 |
| JP | 2008-254997 | 10/2008 |
| JP | 4427347 | 3/2010 |
| JP | 4665175 | 4/2011 |
| JP | 2011-124330 | 6/2011 |
| WO | 2009/130987 A1 | 10/2009 |
| WO | 2012/111616 A1 | 8/2012 |

OTHER PUBLICATIONS

International Search Report and Written Opinion (Application No. PCT/JP2014/063221) dated Aug. 26, 2014 (with English Translation).

* cited by examiner

*Primary Examiner* — Laura A Auer
(74) *Attorney, Agent, or Firm* — Burr & Brown, PLLC

(57) ABSTRACT

Disclosed is a self-supporting zinc oxide substrate composed of a plate composed of a plurality of zinc-oxide-based single crystal grains, wherein the plate has a single crystal structure in an approximately normal direction, and the zinc-oxide-based single crystal grains have a cross-sectional average diameter of greater than 1 μm. This substrate can be manufactured by a method comprising providing an oriented polycrystalline sintered body; forming a layer with a thickness of 20 μm or greater composed of zinc-oxide-based crystals on the oriented polycrystalline sintered body so that the layer has crystal orientation mostly in conformity with crystal orientation of the oriented polycrystalline sintered body; and removing the oriented polycrystalline sintered body to obtain the self-supporting zinc oxide substrate. The present invention can provide a self-supporting zinc oxide substrate being inexpensive and also suitable for having a large area as a preferable alternative material for a zinc oxide single crystal substrate.

12 Claims, No Drawings

ZINC OXIDE FREE-STANDING SUBSTRATE AND METHOD FOR MANUFACTURING SAME

CROSS-REFERENCE TO RELATED APPLICATIONS

This application is a continuation application of PCT/JP2014/63221 filed on May 19, 2014, which claims priority to Japanese Patent Application No. 2013-115753 filed on May 31, 2013 and Japanese Patent Application No. 2014-016606 filed on Jan. 31, 2014, the entire disclosures of which are incorporated herein by reference.

BACKGROUND OF THE INVENTION

1. Field of the Invention

The present invention relates to a self-supporting zinc oxide substrate and a manufacturing method therefor.

2. Description of the Related Art

Zinc oxide (hereinafter also referred to as ZnO) is a semiconductor having a band gap of about 3.3 to 3.4 eV, and has excellent optical transparency. Also, zinc oxide is an abundant resource, and research has been conducted on applications to various light emitting devices such as LEDs. High-quality single crystal wafers are needed in such uses, and various manufacturing techniques have been proposed. For example, Patent Document 1 (JP4427347B) and Patent Document 2 (JP2004-315361A) disclose techniques for producing ZnO single crystals by a hydrothermal method. Patent Document 3 (JP2011-124330A) discloses a method for growing a ZnO single crystalline film by MOCVD (metal organic chemical vapor deposition).

On the other hand, an oriented ZnO crystalline film has been proposed as well. For example, Patent Document 4 (JP4665175B) discloses an oriented ZnO crystalline film composed of a laminate of ZnO nanosheets, but there are problems that, for example, this laminate is not dense, and its crystallite size is small. Patent Document 5 (JP2004-315342A) discloses an oriented ZnO crystalline film formed on a substrate by an aqueous precipitation method, but the crystal size of the film is as small as 0.1 to 1 μm in diameter.

CITATION LIST

Patent Documents

Patent Document 1: JP4427347B
Patent Document 2: JP2004-315361A
Patent Document 3: JP2011-124330A
Patent Document 4: JP4665175B
Patent Document 5: JP2004-315342A

SUMMARY OF THE INVENTION

However, single crystal substrates in general have small areas and are expensive. In particular, while there are demands for reduction of production costs of LEDs in which large-area substrates are used, it is not easy to mass-produce large-area single crystal substrates, and doing so results in even higher production costs. Accordingly, an inexpensive material is desired that can be a preferable alternative material for single crystal substrates of zinc oxide or the like.

The inventors have currently found that a self-supporting zinc oxide substrate that is inexpensive and also suitable for having a large area can be produced as a preferable alternative material for a zinc oxide single crystal substrate.

Therefore, an object of the present invention is to provide a self-supporting zinc oxide substrate useful as a preferable alternative material for a zinc oxide single crystal substrate, which is inexpensive and also suitable for having a large area.

According to an aspect of the present invention, there is provided a self-supporting zinc oxide substrate composed of a plate composed of a plurality of zinc-oxide-based single crystal grains, wherein the plate has a single crystal structure in an approximately normal direction, and the zinc-oxide-based single crystal grains have a cross-sectional average diameter of greater than 1 μm.

According to another aspect of the present invention, there is provided a method for manufacturing a self-supporting zinc oxide substrate, comprising the steps of:
providing an oriented polycrystalline sintered body;
forming a layer with a thickness of 20 μm or greater composed of zinc-oxide-based crystals on the oriented polycrystalline sintered body so that the layer has crystal orientation mostly in conformity with crystal orientation of the oriented polycrystalline sintered body; and
removing the oriented polycrystalline sintered body to obtain the self-supporting zinc oxide substrate.

DETAILED DESCRIPTION OF THE INVENTION

Self-Supporting Zinc Oxide Substrate
The zinc oxide substrate of the present invention can take the form of a self-supporting substrate. In the present invention, the "self-supporting substrate" means a substrate that does not become deformed or damaged by its own weight when handled and that can be handled as solid matter. The thickness of the self-supporting zinc oxide substrate is not limited as long as self-supporting properties can be provided for the substrate, and is preferably 20 μm or greater, more preferably 100 μm or greater, and even more preferably 300 μm or greater. Although the upper limit of the thickness of the self-supporting zinc oxide substrate should not be specified, the thickness is realistically 3000 μm or less from the viewpoint of production cost.

The self-supporting zinc oxide substrate of the present invention is composed of a plate composed of a plurality of zinc-oxide-based single crystal grains, wherein the plate has a single crystal structure in the approximately normal direction. That is, the self-supporting zinc oxide substrate is composed of a plurality of zinc-oxide-based single crystal grains connected two-dimensionally in the direction in a horizontal plane, and, therefore, has a single crystal structure in the approximately normal direction. Therefore, although the self-supporting zinc oxide substrate is not a single crystal as a whole, the self-supporting zinc oxide substrate has a single crystal structure in terms of local domains. Accordingly, the self-supporting zinc oxide substrate can be used as a substrate for various devices such as light emitting devices, light receiving devices, solar cells, photonic crystals, micro UV lasers, piezoelectric materials, and gas sensors. Yet, the self-supporting zinc oxide substrate of the present invention is not a single crystal substrate. As described above, single crystal substrates in general have small areas and are expensive. In particular, while there are demands in recent years for reduction of production costs of LEDs in which large-area substrates are used, it is not easy to mass-produce large-area single crystal substrates, and doing so results in even higher production costs. On the other hand, the present invention can provide a self-supporting zinc oxide substrate useful as a preferable alternative material for a zinc oxide single crystal substrate, which is inexpensive and also suitable for having a large area.

Preferably, the plurality of zinc-oxide-based single crystal grains constituting the self-supporting substrate have crystal orientation that is mostly aligned in the approximately normal direction. The "crystal orientation that is mostly aligned in the approximately normal direction" is not necessarily limited to crystal orientation that is completely aligned in the normal direction, and means that it may be crystal orientation that is, to some extent, in alignment with the normal or a direction similar thereto as long as desired properties of devices such as light emitting devices including the self-supporting substrate can be ensured. Using an expression derived from the production method, it can also be said that the zinc-oxide-based single crystal grains have a structure in which grains are grown mostly in conformity with the crystal orientation of an oriented polycrystalline sintered body used as a base substrate in producing the self-supporting zinc oxide substrate. The "structure in which grains are grown mostly in conformity with the crystal orientation of an oriented polycrystalline sintered body" means a structure resulting from crystal growth influenced by the crystal orientation of the oriented polycrystalline sintered body, is not necessarily limited to a structure in which grains are grown completely in conformity with the crystal orientation of the oriented polycrystalline sintered body, and may be a structure in which grains are grown, to some extent, in conformity with the crystal orientation of the oriented polycrystalline sintered body as long as desired properties of devices such as light emitting devices in which the self-supporting substrate is used can be ensured. That is, this structure also includes a structure in which grains are grown in crystal orientation different from that of the oriented polycrystalline sintered body. In this sense, the expression "structure in which grains are grown mostly in conformity with crystal orientation" can be paraphrased as "structure in which grains are grown in a manner mostly derived from crystal orientation", and this paraphrasing and the above meaning similarly apply to similar expressions in this specification. Therefore, such crystal growth is preferably epitaxial growth, but it is not limited thereto, and may take a variety of similar crystal growth forms. In any case, with crystals grown in this way, the self-supporting zinc oxide substrate can have a structure, the crystal orientation of which is mostly aligned with respect to the approximately normal direction.

Therefore, the self-supporting zinc oxide substrate is observed as a single crystal when viewed in the normal direction, and it is also possible to recognize it as an aggregate of zinc-oxide-based single crystal grains having a columnar structure in which grain boundaries are observed in a view of the cross section in the horizontal plane direction. Here, the "columnar structure" does not mean only a typical vertically long columnar shape, and is defined as having a meaning encompassing various shapes such as a horizontally long shape, a trapezoidal shape, and an inverted trapezoidal shape. As described above, the self-supporting zinc oxide substrate may have a structure with crystal orientation that is, to some extent, in alignment with the normal or a direction similar thereto, and does not necessarily need to have a columnar structure in a strict sense. As described above, the growth of zinc oxide single crystal grains due to the influence of the crystal orientation of an oriented polycrystalline sintered body used for production of a self-supporting zinc oxide substrate is considered to be the cause of the columnar structure. Therefore, the average grain diameter at the cross section (hereinafter referred to as a cross-sectional average diameter) of zinc oxide single crystal grains that can also be called columnar structures is considered to depend on not only the conditions of film formation but also the average grain diameter at the plate surface of the oriented polycrystalline sintered body.

The crystallinity of zinc-oxide-based single crystal grains constituting the self-supporting zinc oxide substrate tends to be high, and the density of defects such as dislocation can be kept low. Accordingly, it is considered that, in some applications such as light emitting devices, it is even possible to use the self-supporting zinc oxide substrate more preferably than commercially available zinc oxide single crystal substrates. For example, when a functional layer is produced on the self-supporting zinc oxide substrate by epitaxial growth, the functional layer grows mostly in conformity with the base self-supporting zinc oxide substrate and becomes an aggregate of columnar structures. In epitaxial growth, the crystal quality of the base is inherited, and therefore it is possible to obtain high crystal quality in each domain of columnar structures constituting the functional layer. Although the reason why the crystal grains constituting the self-supporting zinc oxide substrate has a low defect density is not clear, it is considered that among the lattice defects occurring during the initial stage of production of the self-supporting zinc oxide substrate, those that develop with tilt toward the horizontal direction are absorbed by the grain boundary as growth progresses, and thus disappear. The grain boundary that defines a boundary between single crystals with respect to the horizontal direction exerts an effect of scattering or reflecting horizontally transmitted light. Therefore, in the case where the self-supporting zinc oxide substrate is applied to a light emitting device having a structure in which light is extracted in the normal direction, a luminance increasing effect due to scattered light from grain boundaries is also expected.

Since crystallinity at the interface between columnar structures constituting the self-supporting zinc oxide substrate is low, a large grain diameter and a small grain boundary area are needed, and the cross-sectional average diameter of the columnar structures needs to be greater than at least 1 µm. When the self-supporting zinc oxide substrate is used as a substrate for an optical device, such as a light emitting device, a cross-sectional average diameter that is not sufficiently large is not preferable because of a reduced visible-light transmittance in the normal direction. Accordingly, the cross-sectional average diameter of single crystal grains of the self-supporting zinc oxide substrate is preferably 3 µm or greater and more preferably 10 µm or greater. Although the upper limit of the cross-sectional average diameter is not particularly limited, the cross-sectional average diameter is realistically 1000 µm or less. The "cross-sectional average diameter" is calculated as follows. First, the cross section of the self-supporting zinc oxide substrate is polished, and then an image of the cross section is taken with a scanning electron microscope. The visual field range is determined in such a way that when straight lines are horizontally drawn through positions (a), (b), and (c), each of horizontally straight lines crosses 10 to 30 single crystal grains, where (a) is the center along a line segment in the thickness direction, (b) is the midpoint between the center and one end along the line segment, and (c) is the midpoint between the center and the other end along the line segment.

The cross-sectional average grain diameter of zinc-oxide-based single crystal grains constituting the self-supporting zinc oxide substrate is determined by horizontally drawing straight lines through positions (a), (b) and (c) so as to cross columnar structures of the single crystal grains on the obtained image, taking the average of the line segment lengths inside all grains crossed by the straight lines, and multiplying the average by 1.5. When the interface (grain boundary) of columnar structures constituting the self-supporting zinc oxide substrate is unclear, the above evaluation may be carried out after performing thermal etching, chemical etching, plasma etching, or similar processing to emphasize the interface. Moreover, as long as an evaluation comparable to the above evaluation can be made, images of segments of a visual field may be taken to make an evaluation.

In order to produce single crystal grains having a cross-sectional average diameter as provided above, it is desirable that the sintered grain diameter at the plate surface of grains that constitute the oriented polycrystalline sintered body used for producing the self-supporting zinc oxide substrate is 1 μm to 1000 μm, more desirably 3 μm to 1000 μm, and even more desirably 10 μm to 1000 μm.

The zinc-oxide-based single crystal grains constituting the self-supporting zinc oxide substrate may contain a dopant or may not contain a dopant. Here, the phrase "not contain a dopant" means that an additive element intentionally imparting a certain function or property is not contained, but, needless to say, inevitable impurities are allowed. Alternatively, the zinc-oxide-based single crystal grains constituting the self-supporting zinc oxide substrate may be doped with an n-type dopant or a p-type dopant, and, in this case, the self-supporting zinc oxide substrate can be used as a functional layer having semiconductor properties. Preferable examples of p-type dopants include one or more selected from the group consisting of nitrogen (N), phosphorus (P), arsenic (As), carbon (C), lithium (Li), sodium (Na), potassium (K), silver (Ag), and copper (Cu). Preferable examples of n-type dopants include one or more selected from the group consisting of aluminum (Al), gallium (Ga), indium (In), boron (B), fluorine (F), chlorine (Cl), bromine (Br), iodine (I), and silicon (Si).

The zinc-oxide-based single crystal grains constituting the self-supporting zinc oxide substrate may be formed into mixed crystals for band gap control. Preferably, the zinc oxide single crystal grains may be composed of ZnO formed into mixed crystals with crystals of one or more selected from the group consisting of MgO, CdO, ZnS, ZnSe, and ZnTe, and p-type zinc oxide and/or n-type zinc oxide single crystal grains may be those in which such mixed-crystal zinc oxide is doped with a p-type dopant or an n-type dopant. For example, doping $Zn_xMg_{1-x}O$, which is a mixed crystal of ZnO and MgO, with N makes it possible to provide a p-type substrate.

It is preferable that the self-supporting zinc oxide substrate has a size of 50.8 mm (2 inches) or greater in diameter, more preferably 100 mm (4 inches) or greater in diameter, and even more preferably 200 mm (8 inches) or greater in diameter. The larger the self-supporting zinc oxide substrate is, the greater the number of producible devices is, and therefore a larger size is preferable from the viewpoint of production cost. Moreover, a larger size is also preferable in the case of using the self-supporting zinc oxide substrate as a substrate for light emitting devices because the usable device area is enlarged so as to expand applications to surface-emitting lightings and the like, and therefore, the upper limits of the area and size thereof should not be specified. It is preferable that the self-supporting zinc oxide substrate is circular or substantially circular as viewed from above, but the shape is not limited thereto. In the case where the self-supporting zinc oxide substrate is not circular or substantially circular, the area is preferably 2026 $mm^2$ or greater, more preferably 7850 $mm^2$ or greater, and even more preferably 31400 $mm^2$ or greater. For applications that do not require a large area, the area may be smaller than the above range such as 50.8 mm (2 inches) or less in diameter, or 2026 $mm^2$ or less in terms of area.

Manufacturing Method

The self-supporting zinc oxide substrate of the present invention can be manufactured by (1) providing an oriented polycrystalline sintered body; (2) forming a layer with a thickness of 20 μm or greater composed of zinc-oxide-based crystals on the oriented polycrystalline sintered body so that the layer has crystal orientation mostly in conformity with crystal orientation of the oriented polycrystalline sintered body; and (3) removing the oriented polycrystalline sintered body to obtain the self-supporting zinc oxide substrate.

(1) Oriented Polycrystalline Sintered Body

An oriented polycrystalline sintered body is provided as a base substrate for producing a self-supporting zinc oxide substrate. Although the composition of the oriented polycrystalline sintered body is not particularly limited, the oriented polycrystalline sintered body preferably contains one selected from the group consisting of zinc oxide (ZnO), alumina ($Al_2O_3$), aluminum nitride (AlN), and galium nitride (GaN) as a main component (or as a main phase), and more preferably alumina or zinc oxide. The oriented polycrystalline sintered body may contain an inevitable impurity, an n-type or p-type dopant, and/or a sintering aid, and may also contain a mixed crystal formed with a different material (such as oriented ZnMgO). The oriented polycrystalline sintered body can be efficiently manufactured through shaping and firing using a commercially available plate-shaped powder, and thus is not only able to be produced at low cost but also suitable for having a large area due to ease in shaping. According to the inventors' findings, by using an oriented polycrystalline sintered body as a base substrate and allowing a plurality of zinc-oxide-based single crystal grains to grow thereon, it is possible to manufacture a self-supporting zinc oxide substrate that is useful as a substrate for various devices.

The oriented polycrystalline sintered body is composed of a sintered body that contains numerous single crystal grains which are to some extent or highly oriented in a certain direction. The use of a polycrystalline sintered body oriented in this way makes it possible to produce a self-supporting zinc oxide substrate having crystal orientation that is mostly aligned in the approximately normal direction, and when a semiconductor material such as zinc oxide or gallium nitride is formed on the self-supporting zinc oxide substrate by epitaxial growth or crystal growth similar thereto, a state in which crystal orientation is mostly aligned in the approximately normal direction is achieved. Accordingly, when such a highly oriented self-supporting zinc oxide substrate is used as a substrate for devices such as light emitting devices, a functional layer can be formed in a state in which its crystal orientation is mostly aligned in the approximately normal direction similarly, and thus superior device characteristics (such as superior luminous efficiency) equivalent to that obtained with a single crystal substrate can be achieved. Alternatively, even when this highly oriented self-supporting zinc oxide substrate is used as a functional layer of devices such as light emitting devices, it is possible to achieve superior device characteristics (such as superior luminous efficiency) comparable to those obtained when a single crystal substrate is used. In any case, in order to produce such a highly oriented self-supporting zinc oxide substrate, an oriented polycrystalline sintered body needs to be used as a base substrate. In addition to commonly used pressureless sintering methods, pressure sintering methods such as hot isostatic pressing (HIP), hot pressing (HP), and spark plasma sintering (SPS), and combination thereof can be used as production methods for obtaining the oriented polycrystalline sintered body.

The oriented polycrystalline sintered body preferably has a size of 50.8 mm (2 inches) or greater in diameter, more preferably 100 mm (4 inches) or greater in diameter, and even more preferably 200 mm (8 inches) or greater in diameter. A larger oriented polycrystalline sintered body is preferable in terms of production cost because it makes it possible to produce self-supporting zinc oxide substrate with a larger area, which can increase the number of producible light emitting devices. Moreover, in the case of using the self-supporting zinc oxide substrate as a substrate for light emitting devices, it is preferable that the oriented polycrystalline sintered body has a large size because the usable device area is enlarged so as to expand applications to surface-emitting lightings and the like, and therefore the upper limits of the area and size thereof should not be specified. It is preferable that the self-supporting zinc oxide substrate is circular or substantially circular as viewed from above, but the shape is not limited thereto. In the case where the self-supporting zinc oxide substrate is not circular or substantially circular, the area is preferably 2026 mm$^2$ or greater, more preferably 7850 mm$^2$ or greater, and even more preferably 31400 mm$^2$ or greater. For applications that do not require a large area, the area may be smaller than the above range such as 50.8 mm (2 inches) or less in diameter, or 2026 mm$^2$ or less in terms of area. Although the thickness of the oriented polycrystalline sintered body is not limited as long as it is self-supporting, an excessively large thickness is not preferable from the viewpoint of production cost. Therefore, the thickness is preferably 20 μm or greater, more preferably 100 μm or greater, and even more preferably 100 to 1000 μm.

The sintered grain diameter at the plate surface of grains constituting the oriented polycrystalline sintered body is preferably 1 μm to 1000 μm, more preferably 3 μm to 1000 μm, and even more preferably 10 μm to 1000 μm. With a sintered grain diameter within such a range, it is easy to produce zinc-oxide-based single crystal grains having a cross-sectional average diameter of greater than 1 μm. Although the sintered grain diameter of the oriented polycrystalline sintered body varies depending on its material, the sintered grain diameter can be suitably adjusted by controlling sintering conditions, such as sintering temperature, and raw-material grain diameter, by adding sintering aids, and by other means. The average grain diameter at the plate surface of sintered body grains in the present invention is measured by the following method. That is, the plate surface of a plate-shaped sintered body is polished, and an image is taken with a scanning electron microscope. The visual field range is determined in such a way that when straight lines are diagonally drawn on the obtained image, each straight line crosses 10 to 30 grains. The average grain diameter at the plate surface is determined by diagonally drawing two straight lines on the obtained image, taking the average of the line segment lengths inside all grains crossed by the straight lines, and multiplying the average by 1.5. When the boundary of sintered body grains cannot be clearly determined on the scanning microscope image of the plate surface, the above evaluation may be carried out after performing processing to emphasize the boundary by thermal etching (for example, for 45 minutes at 1550° C.) or chemical etching.

The material, and the direction of the oriented plane, of the oriented polycrystalline sintered body is not particularly limited as long as the crystal structure is similar to that of zinc oxide, and a zinc oxide film can grow in conformity with the base. For example, in the case where an oriented zinc oxide sintered body is used, the direction of the oriented plane thereof may be the (002) plane, (100) plane, (110) plane, (101) plane, or another plane. As for the degree of orientation, it is preferable that the degree of orientation at the substrate surface is, for example, 50% or greater, more preferably 65% or greater, and even more preferably 75% or greater. This degree of orientation can be calculated by the Lotgering method. For example, in the case of evaluating a c-plane oriented zinc oxide sintered body, the degree of orientation can be determined by obtaining an XRD profile through irradiating the surface of plate-shaped zinc oxide with X-rays using an XRD apparatus (such as product name "RINT-TTR III" manufactured by Rigaku Corporation) and making a calculation according to the formulae below.

[Mathematical Formula 1]
$$F_{(002)} = \frac{p - p_0}{1 - p_0} \times 100$$

$$p_0 = \frac{I_0(002)}{I_0(100) + I_0(002) + I_0(101) + I_0(102) + I_0(110)}$$

$$p = \frac{I_s(002)}{I_s(100) + I_s(002) + I_s(101) + I_s(102) + I_s(110)}$$

where $F_{(002)}$ is the degree of orientation of the c-plane; $I_0(002)$, $I_0(100)$, $I_0(101)$, $I_0(102)$, and $I_0(110)$ are the diffraction intensities (integral values) of the (002) plane, (100) plane, (101) plane, (102) plane, and (110) plane in ICDD No. 361451, respectively; and $I_s(002)$, $I_s(100)$, $I_s(101)$, $I_s(102)$, and $I_s(110)$ are the diffraction intensities (integral values) of the (002) plane, (100) plane, (101) plane, (102) plane, and (110) plane in a sample, respectively.

Moreover, an oriented polycrystalline alumina sintered body is also a preferable oriented polycrystalline sintered body. Alumina is aluminum oxide ($Al_2O_3$) and is typically α-alumina having the same corundum-type structure as single crystal sapphire, and the oriented polycrystalline alumina sintered body is a solid in which a countless number of alumina crystal grains in an oriented state are bonded to each other by sintering. Alumina crystal grains contain alumina and may contain a dopant and an inevitable impurity as other elements, or that may be composed of alumina and an inevitable impurity. Although the oriented polycrystalline alumina sintered body may also contain another phase or another element as described above in addition to alumina crystal grains, preferably the oriented polycrystalline alumina sintered body is composed of alumina crystal grains and an inevitable impurity. The oriented plane of the oriented polycrystalline alumina sintered body is not particularly limited and may be a c-plane, an a-plane, an r-plane, an m-plane, or the like.

The direction in which crystals are oriented in the oriented polycrystalline alumina sintered body is not particularly limited, and it may be the direction of a c-plane, an a-plane, an r-plane, an m-plane, or the like, and from the viewpoint of lattice constant matching with the self-supporting zinc oxide substrate, it is preferable that crystals are oriented along the c-plane or the a-plane. As for the degree of orientation, for example, the degree of orientation at the plate surface is preferably 50% or greater, more preferably 65% or greater, even more preferably 75% or greater, particularly preferably 85% or greater, particularly more preferably 90% or greater, and most preferably 95% or greater. The degree of orientation can be determined by obtaining an XRD profile through irradiating the plate surface of plate-shaped alumina with X-rays using an XRD apparatus (such as RINT-TTR III manufactured by Rigaku Corporation) and making a calculation according to the formulae below.

$$\text{Degree of Orientation } [\%] = \frac{p - p_0}{1 - p_0} \times 100 \quad \text{[Mathematical Formula 2]}$$

$$p_0 = \frac{I_0(hkl)}{\sum I_0(hkl)}$$

$$p = \frac{I_s(hkl)}{\sum I_s(hkl)}$$

where $I_0(hkl)$ and $I_s(hkl)$ are the integral values (2θ=20-70°) of the diffraction intensities from the (hkl) planes in ICDD No. 461212 and a sample, respectively.

The oriented polycrystalline alumina sintered body can be manufactured by shaping and sintering, using a plate-shaped alumina powder as a raw material. A plate-shaped alumina powder is sold in the market and is commercially available. Preferably, a plate-shaped alumina powder can be shaped into an oriented green body by a technique that uses shearing force. Preferable examples of techniques that use shearing force include tape casting, extrusion molding, doctor blade method, and any combination thereof. In the orientation technique that uses shearing force, it is preferable, in any technique exemplified above, that additives such as a binder, a plasticizer, a dispersant, and a dispersion medium are suitably added to the plate-shaped alumina powder to form a slurry, and the slurry is allowed to pass through a slit-shaped narrow discharge port to discharge the slurry to shape a sheet form on a base. The slit width of the discharge port is preferably 10 to 400 μm. The amount of the dispersion medium is adjusted so that the viscosity of the slurry is preferably 5000 to 100000 cP and more preferably 20000 to 60000 cP. The thickness of the oriented green body shaped into a sheet form is preferably 5 to 500 μm and more preferably 10 to 200 μm. It is preferable that multiple pieces of this oriented green body that has been shaped into a sheet form are stacked to form a precursor laminate having a desired thickness, and this precursor laminate is subjected to pressing. This pressing can be preferably performed by packaging the precursor laminate in a vacuum pack or the like and subjecting it to isostatic pressing in hot water at a temperature of 50 to 95° C. under a pressure of 10 to 2000 kgf/cm². Moreover, when extrusion molding is used, the flow channel within a metal mold may be designed so that after passing through a narrow discharge port within the metal mold, sheets of the green body are integrated into a single body within the metal mold, and the green body is ejected in a laminated state. It is preferable to degrease the resulting green body in accordance with known conditions. The oriented green body obtained in the above manner is fired by, in addition to ordinal pressureless firing, pressure sintering methods such as hot isostatic pressing (HIP), hot pressing (HP), and spark plasma sintering (SPS), and combination thereof, to form an alumina sintered body containing oriented alumina crystal grains. Although the firing temperature and the firing time in the above firing depend on the firing method, the firing temperature may be 1100 to 1900° C. and preferably 1500 to 1800° C., and the firing time may be 1 minute to 10 hours and preferably 30 minutes to 5 hours. Firing is preferably performed through a first firing step of firing the green body by a hot pressing at a temperature of 1500 to 1800° C. for 2 to 5 hours under a surface pressure of 100 to 200 kgf/cm², and a second firing step of re-firing the resulting sintered body with hot isostatic pressing (HIP) at a temperature of 1500 to 1800° C. for 30 minutes to 5 hours under a gas pressure of 1000 to 2000 kgf/cm². The firing time at the aforementioned firing temperature is not particularly limited, and is preferably 1 to 10 hours and more preferably 2 to 5 hours. The alumina sintered body obtained in this way is a polycrystalline alumina sintered body oriented in the direction of a desired plane such as a c-plane in accordance with the type of the aforementioned raw-material plate-shaped alumina powder. It is preferable that the oriented polycrystalline alumina sintered body obtained in this way is ground with grinding wheel to flatten the plate surface, and then the plate surface is smoothed by lapping using diamond abrasive grains to obtain an oriented alumina substrate.

(2) Formation of Zinc Oxide Crystal Layer

A layer with a thickness of 20 μm or greater composed of zinc-oxide-based crystals (hereinafter referred to as a zinc oxide crystal layer) is formed on the oriented polycrystalline sintered body so that the layer has crystal orientation that is mostly in conformity with the crystal orientation of the oriented polycrystalline sintered body. Preferable examples of methods for forming the zinc oxide crystal layer include solid phase epitaxial methods and liquid phase epitaxial methods such as an aqueous precipitation method, a hydrothermal method, a spin-coating method, and a dipping method. A solid-phase epitaxial method can be preferably performed by, for example, forming a film on a substrate by an aerosol deposition method (AD method) in advance and then heating the film to form a single crystal. A liquid-phase epitaxial method is suitable for forming a thick zinc oxide crystal layer, and an aqueous precipitation method or a hydrothermal method is particularly suitable.

Prior to forming the zinc oxide crystal layer, a seed crystal layer composed of a zinc-oxide-based material may be formed on the oriented polycrystalline sintered body so that the seed crystal layer has crystal orientation that is mostly in conformity with the crystal orientation of the oriented polycrystalline sintered body. This is an effective technique in the case of using a material different from zinc oxide for the oriented polycrystalline sintered body. The composition and the structure of seed crystals are not particularly limited, and seed crystals having a crystal structure with a lattice constant close to that of zinc oxide may be used, such as zinc oxide, gallium nitride, and a mixed crystal containing zinc oxide or gallium nitride as its main component. A method for forming a seed crystal layer is not particularly limited, and vapor phase methods such as MOCVD (metal organic chemical vapor deposition), MBE (molecular beam epitaxy), and a sputtering method may be used.

(3) Removal of Oriented Polycrystalline Sintered Body

The self-supporting zinc oxide substrate is obtained by removing the oriented polycrystalline sintered body. A method for removing the oriented polycrystalline sintered body is not particularly limited, and examples include machine grinding, chemical etching, interfacial heating by laser irradiation from the oriented polycrystalline sintered body side (laser lift-off), spontaneous separation utilizing a difference in thermal expansion when the temperature is increased, and the like.

EXAMPLES

The present invention will now be more specifically described by way of the following examples.

Example 1: Production of Self-Supporting Oriented ZnO Substrate Using Oriented $Al_2O_3$ Sintered Body (1) Production of c-Plane Oriented Alumina Sintered Body As a raw material, a plate-shaped alumina powder (manufactured by Kinsei Matec Co., Ltd., grade 00610) was provided. 7 parts by weight of a binder (polyvinyl butyral: lot number BM-2, manufactured by Sekisui Chemical Co., Ltd.), 3.5 parts by weight of a plasticizer (DOP: di(2-ethylhexyl)phthalate, manufactured by Kurogane Kasei Co., Ltd.), 2 parts by weight of a dispersant (Rheodol SP-030, manufactured by Kao Corporation), and a dispersion medium (2-ethylhexanol) were mixed with 100 parts by weight of the plate-shaped alumina particles. The amount of the dispersion medium was adjusted so that the slurry viscosity was 20000 cP. The slurry prepared as above was shaped into a sheet form on a PET film by a doctor blade method so as to have a dry thickness of 20 μm. The resulting tape was cut into circles having a diameter of 50.8 mm (2 inches), then 150 pieces were stacked and placed on an Al plate having a thickness of 10 mm, and then vacuum packing was performed. This vacuum pack was subjected to isostatic pressing in hot water at 85° C. under a pressure of 100 kgf/cm², and a disc-shaped green body was obtained.

The resulting green body was placed in a degreasing furnace and degreased at 600° C. for 10 hours. The resulting degreased body was fired in a hot press at 1600° C. for 4 hours under a surface pressure of 200 kgf/cm² in nitrogen using a graphite mold. The resulting sintered body was re-fired at 1700° C. for 2 hours under a gas pressure of 1500 kgf/cm² in argon by hot isostatic pressing (HIP).

The sintered body obtained in this way was fixed to a ceramic surface plate and ground to #2000 using a grinding wheel to flatten the plate surface, and thus an oriented alumina sintered body having a diameter of 50.8 mm (2 inches) and a thickness of 1 mm was obtained as an oriented alumina substrate. Furthermore, flatness was improved by reducing the size of abrasive grains from 3 μm to 0.5 μm in a stepwise manner. The average roughness Ra after processing was about 80 nm.

(2) Evaluation of Oriented Alumina Substrate
(Evaluation of Degree of Orientation)

To check the degree of orientation of the resulting oriented alumina substrate, the degree of orientation of the c-plane, which is the measurement-target crystal plane in this experimental example, was measured by XRD. An XRD profile was obtained through irradiating the plate surface of the oriented alumina substrate with X-rays within the range of 2θ=20-70° using an XRD apparatus (RINT-TTR III manufactured by Rigaku Corporation). The degree of orientation of the c-plane was calculated according to the following formulae. As a result, the value of the degree of orientation of the c-plane in this experimental example was 97%.

$$F_{(006)} = \frac{p - p_0}{1 - p_0} \times 100 \quad \text{[Mathematical Formula 3]}$$

$$p_0 = \frac{I_0(006)}{\sum I_0(hkl)}$$

$$p = \frac{I_s(006)}{\sum I_s(hkl)}$$

where $F_{(006)}$ is the degree of orientation of the c-plane, $I_0(hkl)$ and $I_s(hkl)$ are the diffraction intensities (integral values) from the (hkl) planes in ICDD No. 461212 and a sample, respectively.

(Evaluation of Sintered Body Grain Diameter)

Concerning the sintered body grains of the oriented alumina substrate, the average grain diameter at the plate surface was measured by the following method. The plate surface of the resulting oriented alumina substrate was polished and subjected to thermal etching at 1550° C. for 45 minutes, and then an image was taken with a scanning electron microscope. The visual field range was determined in such a way that each of straight lines drawn diagonally in the obtained image crossed 10 to 30 grains. The average grain diameter at the plate surface was determined by diagonally drawing two straight lines on the obtained image, taking the average of the line segment lengths inside all grains crossed by the straight lines, and multiplying the average by 1.5. As a result, the average grain diameter at the plate surface was 100 μm.

(3) Production of Self-Supporting ZnO Substrate
(3a) Film Formation of Seed Crystal Layer Using an RS-MBE (radical source molecular beam epitaxy) apparatus, zinc (Zn), which is a metal material, was irradiated in a Knudsen cell and supplied onto the oriented alumina substrate. Oxygen (O), which is a gaseous material, was supplied as an oxygen radical in an RF radical generator, using $O_2$ gas as a raw material. As for the purity of various raw materials that were used, the purity for Zn was 7N while that for $O_2$ was 6N. The substrate was heated to 700° C. using a resistance heater, and a film of a ZnO layer having a thickness of 100 nm was formed while controlling the flux of various gas sources such that the atomic ratio of Zn to O was 1:1.

(3b) Film Formation of ZnO Layer by Aqueous Precipitation Method
(3b-1) Preparation of Aqueous Growth Solution In order to produce an aqueous growth solution, zinc nitrate was dissolved in pure water to provide 0.1 M solution as solution A, while hexamethylenetetramine (HMT) was dissolved in pure water to provide 0.1 M solution as solution B. Sodium di-2-ethylhexyl sulfosuccinate was dissolved in 1-butanol to provide a 0.1 M solution as solution C. Pure water was added to these solutions, and mixing and stirring were performed to have a volume ratio of solution A:solution B:solution C:pure water=5:5:2:10, thereby providing an aqueous growth solution.

(3b-2) Precipitation of ZnO Film

The oriented alumina substrate was placed upright in 1 liter of the aqueous growth solution. Next, a waterproofed ceramic heater and a magnetic stirrer were placed in the aqueous solution, and the aqueous solution was heated with the heater while being gently stirred with the stirrer. The heater temperate was raised to 75° C. and kept for 1 hour to allow a ZnO film to precipitate on the oriented alumina substrate. With suitable adjustment and replacement of the aqueous growth solution, the ZnO film precipitation process was performed 50 times. Thereafter, the oriented alumina substrate on which a ZnO film had precipitated was washed with pure water, and dried at 60° C. in air. In this way, a sample having a ZnO film on its surface was obtained.

(3b-3) Result of Evaluating ZnO Film

When the resulting sample was observed, a precipitated ZnO film having a thickness of about 900 μm was confirmed. According to cross-sectional SEM observations, neither pores nor cracks were detected in the sample.

(4) Removal of Oriented Alumina Substrate

Next, the oriented alumina substrate portion of the sample was removed by grinding with a grinding wheel to perform a smoothing process, and thereby a self-supporting ZnO substrate having a thickness of about 500 μm was obtained. In the smoothing process, flatness was improved by reducing the size of abrasive grains from 3 μm to 0.1 μm in a stepwise manner.

(5) Evaluation of Cross-Sectional Average Diameter

The cross-sectional average diameter of the columnar structures of the self-supporting ZnO substrate was measured by the following method. The cross section of the sample was polished and subjected to thermal etching at 1250° C. for 45 minutes, and an image of the cross section was taken with a scanning electron microscope. The visual field range was determined in such a way that when straight lines were drawn in parallel to the plate surface so as to cross columnar structures through positions (a), (b), and (c), each of straight lines crossed 10 to 30 columnar structures, where (a) was the center along a line segment in the thickness direction, (b) was the midpoint between the center and one end along the line segment, and (c) was the midpoint between the center and the other end along the line segment. Since the interface of columnar structures was unclear in low-magnification imaging, images were taken after suitably dividing the visual field. The cross-sectional average grain diameter of ZnO-based single crystal grains constituting the self-supporting ZnO substrate was determined by horizontally drawing straight lines through positions (a), (b) and (c) so as to cross columnar structures on the obtained image, taking the average of the line segment lengths inside all grains crossed by the straight lines, and multiplying the average by 1.5. As a result, the cross-sectional average diameter was about 100 μm. In this example, it was possible to clearly determine the interface on the scanning microscope image of the thermally-etched cross section, but the above evaluation may be carried out after emphasizing the interface by chemical etching or plasma etching.

Example 2: Production of Self-Supporting Oriented ZnO Substrate Using Oriented ZnO Sintered Body (1) Production of c-Plane Oriented ZnO Sintered Body
(1a) Production of Plate-Shaped Zinc Oxide Powder A c-plane oriented ZnO powder was produced as follows. 173 parts by weight of zinc sulfate heptahydrate (manufactured by Kojundo Chemical Laboratory Co., Ltd.) and 0.45 parts by weight of sodium gluconate (manufactured by Wako Pure Chemical Industries, Ltd.) were dissolved in 300 parts by weight of ion exchanged water. The solution thus obtained was placed in a beaker and dissolved by heating to 90° C. while being stirred with a magnetic stirrer. This solution was kept at 90° C., and 49 parts by weight of 25% aqueous ammonia was added dropwise with a microtube pump while being stirred. After the end of dropwise addition, the solution was kept for 4 hours at 90° C. while being stirred, and then the solution was added to a large amount of ion exchanged water and left to stand still. The precipitates deposited in the bottom of the vessel were separated by filtration, further, washed with ion exchanged water 3 times, and dried to provide a zinc oxide precursor material in the form of a white powder. The resulting zinc oxide precursor material was placed on a zirconia plate and calcined in air in an electric furnace to provide a plate-shaped porous zinc oxide powder. The temperature schedule during calcination was as follows: the temperature was increased at a rate of temperature increase of 100° C./h from room temperature to 900° C., then kept at 900° C. for 30 minutes, and cooled naturally.

(1b) Shaping and Firing Steps 100 parts by weight of the resulting plate-shaped zinc oxide particles were mixed with 15 parts by weight of a binder (polyvinyl butyral: Part No. BM-2, manufactured by Sekisui Chemical Co., Ltd.), 10 parts by weight of a plasticizer (DOP: di(2-ethylhexyl)phthalate, manufactured by Kurogane Kasei Co., Ltd.), 3 parts by weight of a dispersant (trade name: Rheodol SP-030, manufactured by Kao Corporation), and a dispersion medium (2-ethylhexanol). The amount of the dispersion medium was adjusted such that the slurry viscosity was 10000 cP. The slurry thus prepared was applied to a PET film by a doctor blade method to shape a sheet form having a thickness after drying of 20 μm. The resulting tape was cut into 20×20 cm sheet, and 500 pieces of the cut tape were stacked, placed on an aluminum plate having a thickness of 10 mm, and then vacuum-packed. This vacuum pack was subjected to isostatic pressing in hot water at 85° C. under a pressure of 100 kgf/cm$^2$ to prepare a green body in a plate shape. The resulting green body was placed in a degreasing furnace and degreased at 600° C. for 20 hours. The resulting degreased body was fired under an atmospheric pressure at 1400° C. for 5 hours in nitrogen to prepare a ZnO oriented sintered body substrate in a plate shape.

A circular plate having a diameter of 50.8 mm (2 inches) was cut out from the sintered body obtained in this way. The circular plate was fixed to a ceramic surface plate and ground to #2000 using a grinding wheel to flatten the plate surface, and thus an oriented ZnO sintered body having a diameter of 2 inches and a thickness of 1 mm was obtained as an oriented ZnO substrate. Furthermore, flatness was improved by reducing the size of abrasive grains from 3 μm to 0.5 μm in a stepwise manner. The average roughness Ra after processing was about 50 nm.

(2) Evaluation of Sintered Body Substrate

The resulting oriented ZnO substrate was evaluated as follows.

(Evaluation of Degree of Orientation)

To check the degree of orientation of the resulting oriented ZnO substrate, the degree of orientation of the c-plane, which is the measurement-target crystal plane in this experimental example, was measured by XRD. An XRD profile was obtained through irradiating the plate surface of the oriented ZnO substrate with X-rays within the range of 2θ=20-70° using an XRD apparatus (RINT-TTR III manufactured by Rigaku Corporation). The degree of orientation of the c-plane was calculated according to the following formulae. As a result, the value of the degree of orientation of the c-plane in this experimental example was 80%.

$$F_{(006)} = \frac{p - p_0}{1 - p_0} \times 100 \quad \text{[Mathematical Formulae 4]}$$

$$p_0 = \frac{I_0(002)}{I_0(100) + I_0(002) + I_0(101) + I_0(102) + I_0(110)}$$

-continued $$p = \frac{I_s(002)}{I_s(100) + I_s(002) + I_s(101) + I_s(102) + I_s(110)}$$

where $F_{(002)}$ is the degree of orientation of the c-plane; $I_0(002)$, $I_0(100)$, $I_0(101)$, $I_0(102)$, and $I_0(110)$ are the diffraction intensities (integral values) from the (002) plane, (100) plane, (101) plane, (102) plane, and (110) plane in ICDD No. 361451, respectively; and $I_s(002)$, $I_s(100)$, $I_s(101)$, $I_s(102)$, and $I_s(110)$ are the diffraction intensities (integral values) from the (002) plane, (100) plane, (101) plane, (102) plane, and (110) plane in a sample, respectively.

(Evaluation of Sintered Body Grain Diameter)

Concerning the sintered body grains of the oriented ZnO substrate, the average grain diameter at the plate surface was measured by the following method. The plate surface of the resulting oriented ZnO substrate was polished and subjected to etching with nitric acid having a concentration of 0.3 M for 10 seconds, and then an image was taken with a scanning electron microscope. The visual field range was determined in a way such that when straight lines were diagonally drawn on the obtained image, each straight line crossed 10 to 30 grains. The average grain diameter at the plate surface was determined by diagonally drawing two straight lines on the obtained image, taking the average of the line segment lengths inside all grains crossed by the straight lines, and multiplying the average by 1.5. As a result, the average grain diameter at the plate surface was 38 μm.

(3) Production of Self-Supporting ZnO Substrate

A ZnO film having a thickness of about 900 μm was formed in the same manner as Example 1 except that the oriented ZnO substrate was used in place of the oriented alumina substrate, and no seed crystal layer film was formed. Next, the removal of the oriented ZnO substrate, grinding processing, and evaluation of the cross-sectional average diameter were performed in the same manner as Example 1 to provide a self-supporting ZnO substrate having a thickness of 500 μm and a cross-sectional average diameter of about 40 μm.

Example 3: Self-Supporting Oriented ZnO Substrate by Hydrothermal Method

Zinc nitrate was dissolved in pure water so as to be 0.1 M to provide solution A. Next, 1 M aqueous ammonia was provided as solution B. These solutions were mixed and stirred such that the volume ratio solution A:solution B was 1:1 to provide an aqueous growth solution. Next, an oriented ZnO substrate produced in the same manner as step (1) of Example 2 was placed upright in 1 liter of the aqueous growth solution and then in an autoclave to perform hydrothermal treatment at 270° C. for 24 hours, thereby causing a ZnO film to precipitate on the oriented ZnO substrate. With suitable adjustment and replacement of the aqueous growth solution, the ZnO film precipitation process was performed 30 times, and then annealing treatment was performed at 500° C. in air to form a ZnO film having a thickness of about 1000 μm. Next, the removal of the oriented ZnO substrate, grinding processing, and evaluation of the cross-sectional average diameter were performed in the same manner as Example 1 to provide a self-supporting ZnO substrate having a thickness of 500 μm and a cross-sectional average diameter of 40 μm.

What is claimed is:

1. A self-supporting zinc oxide substrate composed of a plate having two opposed major surfaces and a plurality of zinc-oxide-based single crystal grains connected two-dimensionally in the direction of a horizontal plane parallel to said major surfaces, wherein the plate has a single crystal structure in a direction approximately perpendicular to said horizontal plane, and the zinc-oxide-based single crystal grains have a cross-sectional average diameter of greater than 1 μm.

2. The self-supporting zinc oxide substrate according to claim 1, wherein the zinc oxide-based single crystal grains have a cross-sectional average diameter of 3 μm or greater.

3. The self-supporting zinc oxide substrate according to claim 1, having a thickness of 20 μm or greater.

4. The self-supporting zinc oxide substrate according to claim 1, having a diameter of 100 mm or greater.

5. The self-supporting zinc oxide substrate according to claim 1, wherein the zinc-oxide-based single crystal grains have crystal orientation that is aligned in the approximately normal direction.

6. The self-supporting zinc oxide substrate according to claim 1, wherein the zinc-oxide-based single crystal grains are doped with an n-type dopant or a p-type dopant.

7. The self-supporting zinc oxide substrate according to claim 1, wherein the zinc-oxide-based single crystal grains are free from a dopant.

8. A method for manufacturing a self-supporting zinc oxide substrate according to claim 1, comprising the steps of:
   providing an oriented polycrystalline sintered body;
   forming a layer with a thickness of 20 μm or greater composed of zinc-oxide-based crystals on the oriented polycrystalline sintered body so that the layer has crystal orientation mostly in conformity with crystal orientation of the oriented polycrystalline sintered body; and
   removing the oriented polycrystalline sintered body to obtain the self-supporting zinc oxide substrate.

9. The method according to claim 8, further comprising the step of forming a seed crystal layer composed of a zinc-oxide-based material on the oriented polycrystalline sintered body so that the seed crystal layer has crystal orientation mostly in conformity with the crystal orientation of the oriented polycrystalline sintered body, wherein the step is performed prior to forming the layer composed of zinc-oxide-based crystals.

10. The method according to claim 8, wherein the oriented polycrystalline sintered body comprises one selected from the group consisting of zinc oxide (ZnO), alumina ($Al_2O_3$), aluminum nitride (AlN), and gallium nitride (GaN) as a main component.

11. The method according to claim 8, wherein an average grain diameter of grains constituting the oriented polycrystalline sintered body at a plate surface is 1 to 1000 μm.

12. The method according to claim 8, wherein the layer composed of zinc-oxide-based crystals is formed by way of solid phase epitaxial growth or liquid phase epitaxial growth.

* * * * *